(12) United States Patent
Bogin et al.

(10) Patent No.: US 6,584,526 B1
(45) Date of Patent: Jun. 24, 2003

(54) INSERTING BUS INVERSION SCHEME IN BUS PATH WITHOUT INCREASED ACCESS LATENCY

(75) Inventors: Zohar Bogin, Folsom, CA (US); Serafin E. Garcia, Folsom, CA (US); Steven J. Clohset, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 09/667,049

(22) Filed: Sep. 21, 2000

(51) Int. Cl.[7] .................. G06F 13/38; G06F 11/10; G06F 7/00; G11C 7/00
(52) U.S. Cl. ................ 710/124; 710/7; 714/758
(58) Field of Search ............ 710/7, 124, 305, 710/313; 714/48, 758; 340/7.44; 365/201; 711/100

(56) References Cited

U.S. PATENT DOCUMENTS

| | | | | |
|---|---|---|---|---|
| 3,825,893 A | * | 7/1974 | Bossen et al. | |
| 5,012,472 A | * | 4/1991 | Arimoto et al. | |
| 5,384,789 A | * | 1/1995 | Tomita | |
| 6,098,115 A | * | 8/2000 | Eberhard et al. | |
| 6,272,651 B1 | * | 8/2001 | Chin et al. | |

* cited by examiner

Primary Examiner—Gopal C. Ray
(74) Attorney, Agent, or Firm—Blakely, Sokoloff, Taylor & Zafman LLP

(57) ABSTRACT

A technique to reduce accumulated latencies in bus transmission time when a bus inversion scheme is employed. The bus inversion scheme inverts all the data bits whenever more than one-half of the data bits are active, so that the bus never has more that one-half of the bits active during a data transfer. This minimizes the number of driver circuits that are actively driving the bus at any given time. Since it takes a certain amount to time to determine if more than one-half of the bits are active, this process can add to overall latency, or data transfer time on the bus. By placing the bus inversion function in parallel with another function that also contributes to bus latency, such as error correction code (ECC) calculation, only the more time-consuming of the two functions will increase bus latency.

19 Claims, 4 Drawing Sheets

INSERTING BUS INVERSION SCHEME IN BUS PATH WITHOUT INCREASED ACCESS LATENCY

BACKGROUND OF THE INVENTION

1. Field of the Invention

The invention pertains generally to computer data buses. In particular, it pertains to reducing latency on a bus by performing a data bus inversion operation in parallel with an error correction operation.

2. Description of the Related Art

Improvements in processor speed have increased the pressure to transfer data more quickly throughout the computer system. In a related effort, system designers attempt to minimize power consumption and electrical noise caused by high-speed switching on the data lines. This has led to a development described as Data Bus Inversion (DBI), which is a bus technique that examines the data bits being transmitted over the parallel lines of a data bus, determines the number of bits that are active (meaning the line is being driven by an active transistor output rather than being passively held at a predetermined voltage level by an inactive output), and inverts the data bits if more than half of them are active, thereby resulting in less than half of them being active on the bus. This minimizes the number of line driver transistors that are active during any given data transfer, resulting in a reduction in power consumption and a reduction of the other problems that are caused by multiple high speed lines being turned on at the same time.

FIG. 1 shows an example of a system 1 using DBI. A bus requester 10 (a device that can initiate a transfer over the bus) makes a request to write to memory 11 over data bus 18, which may have multiple parallel data lines. A diagonal slash across a connecting line in the figures indicates multiple parallel lines (for example, 16 or 32 lines) that are illustrated as a single line for simplicity.

Requestor 10 can be a processor or any other device capable of initiating a read or write operation to memory. The data lines from requestor 10 go to inverter 16, where they may or may not be inverted before being placed on bus 18. The data lines are also monitored by inversion decision logic 14. In the case of a write operation, the data from device 10 is examined by decision logic 14 to determine if more than half the data lines are active. If they are, decision logic 14 sends a signal to inverter 16 to invert the data lines before placing them on bus 18. If fewer than half of the data lines are not active, the signal from logic 14 to inverter 16 indicates that no inversion is necessary, and inverter 16 allows the data signals to pass to bus 18 without inversion.

If the data has been inverted, the receiving circuitry must invert it again to restore the original data. If the data has not been inverted, the receiving circuit leaves the data as it is. Since the receiving circuit must know which to do, a status line 19 is incorporated in the bus to indicate whether the data is inverted. If inversion decision logic 15 receives an indication of inversion over line 19, it sends a signal to inverter 17 to invert the data back to its original form before passing the data on to memory 11.

The system can also work in the opposite direction for data being read from memory, with decision logic 15 deciding whether to invert the data, and sending a signal on status line 19 telling decision logic 14 whether to reinvert the data before passing the data to requester 10.

While inverting the data is simple and fast, deciding whether to invert the data involves a time-consuming process of counting the active bits. This time is added to the amount of time it takes to complete a data transfer. This increase in latency, while small in absolute terms, can be a significant fraction of bus transfer time when dealing with high-speed data buses capable of transferring data in nanoseconds. An increase of 10–20% in bus latency can reduce bus bandwidth by a comparable amount, resulting in a significant loss of system performance.

The bus latency problem is further aggravated by the operation of error correction code circuitry, as shown in system 2 of FIG. 2. RAM memory is commonly subject to data errors. To counteract this, most modern memory systems incorporate error correction code (ECC) logic. When write data is received, ECC logic 23 generates a multi-bit code based on the particular bit pattern in the data, and stores that code in memory with the associated data. When the data is later read from memory, the ECC code is calculated again using the same algorithm, based on the data just read from memory 21. If the old and new codes match, the data is considered correct and is handled normally. However, if the two codes disagree, ECC logic 23 assumes an error in the data from memory, so it corrects the error based on the ECC code retrieved from memory. ECC algorithms permit most errors to be corrected in this manner, thus allowing the data to be forwarded and processing to continue. Unfortunately, generating and comparing the ECC code also takes a finite amount of time, which is added to the total time for the data transfer. If an error occurs and the data has to be corrected, the additional time delay is even greater.

The benefits of ECC data correction are generally considered to outweigh the resultant increase in bus latency. However, when the delay caused by DBI is added to the delay caused by ECC, the total latency in a bus transaction may become intolerable.

DETAILED DESCRIPTION OF THE INVENTION

The invention reduces or eliminates the effects of delays in the inversion decision logic by performing that function in parallel with other bus functions that also take time. In one embodiment, the inversion decision logic operates in parallel with the ECC logic.

Figure 1:
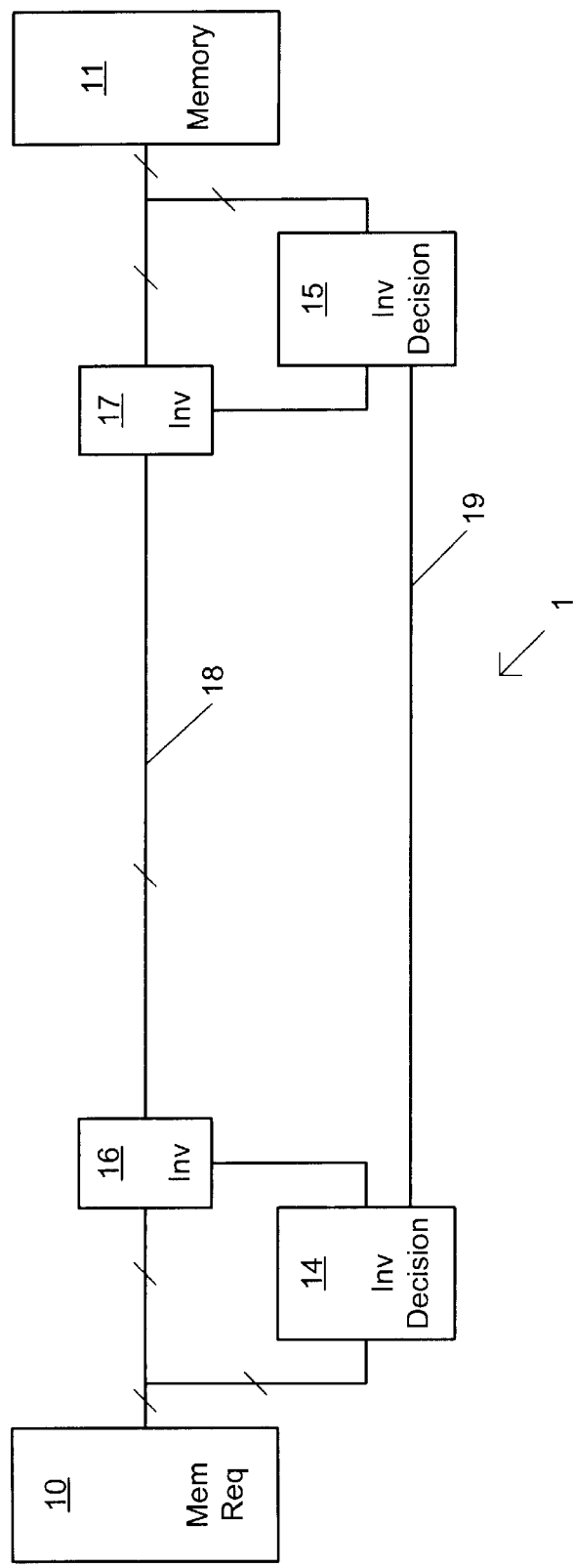
FIG. 1 shows a conventional system using DBI.
Figure 2:
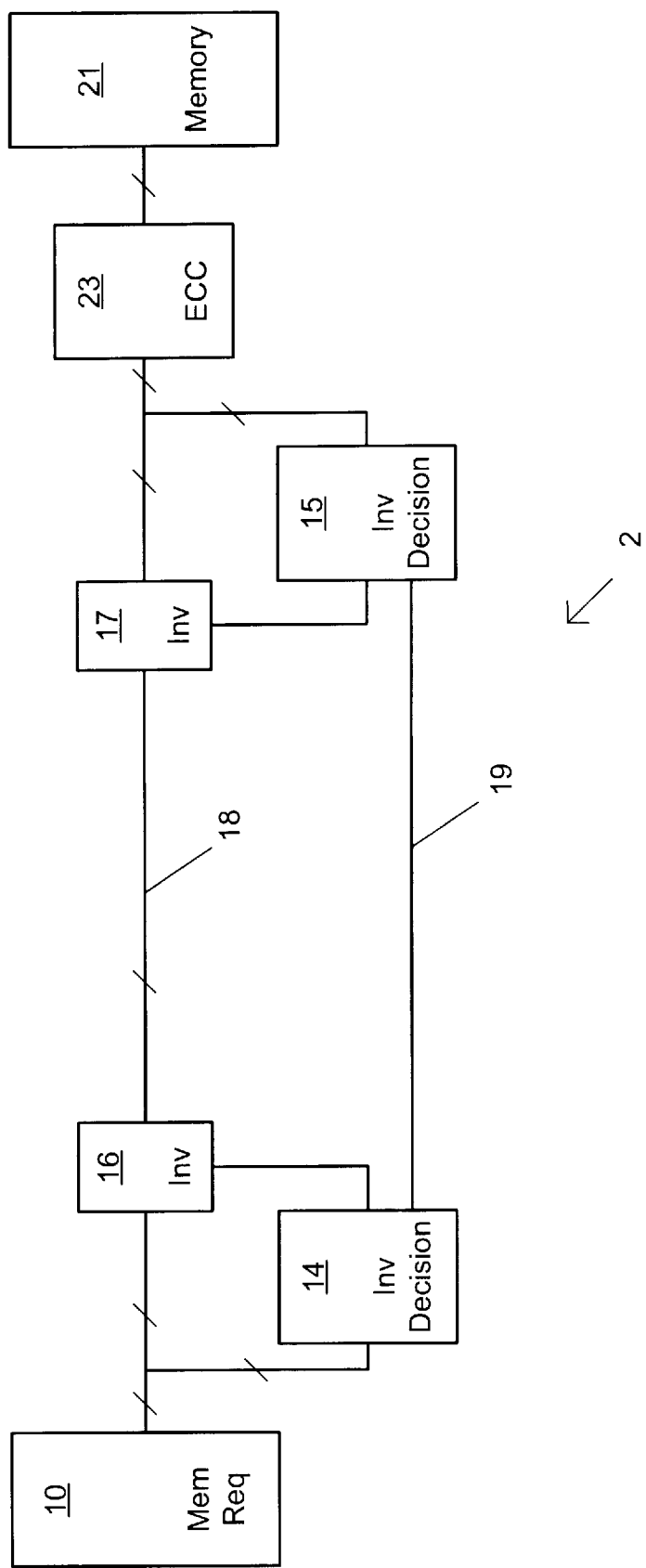
FIG. 2 shows a conventional system using DBI and ECC.
Figure 3:
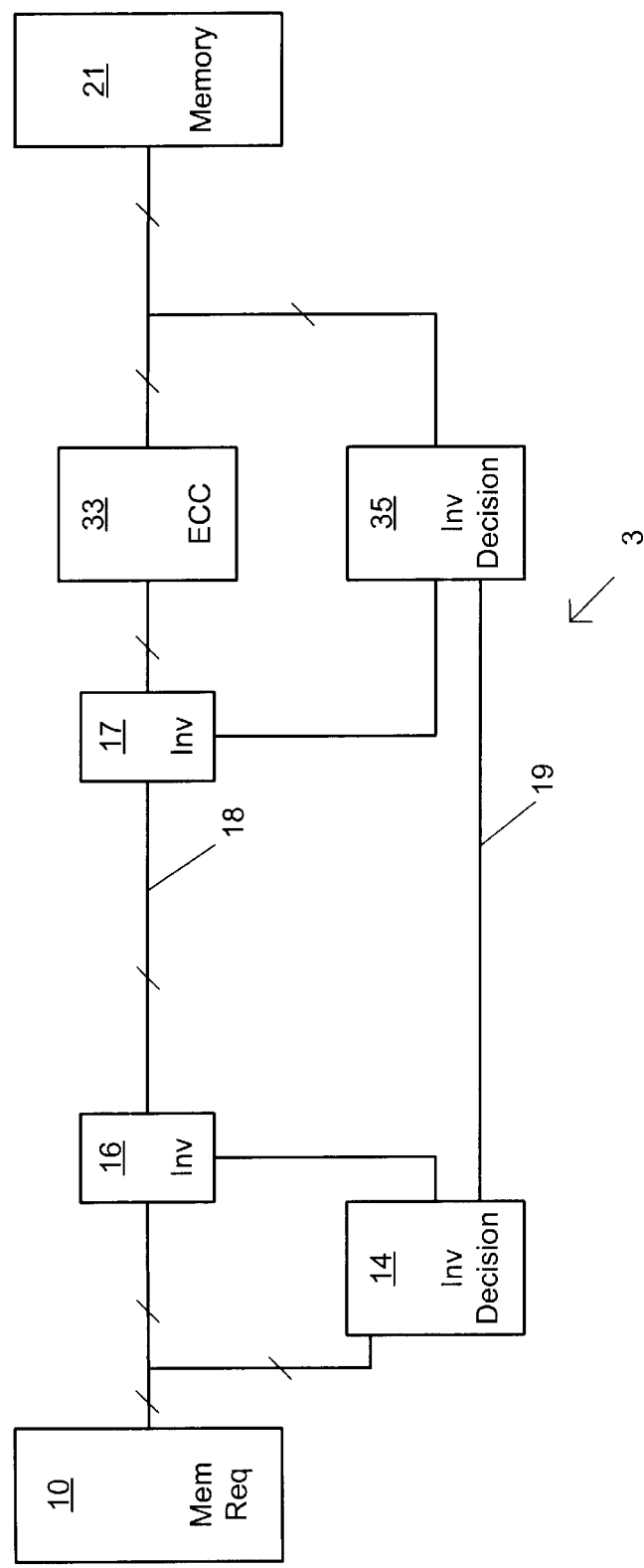
FIG. 3 shows a system of the invention.

FIG. 3 shows one embodiment of a system 3 of the invention, in which inversion decision logic 35 operates in parallel with ECC logic 33. A bus requestor 10 (a device that can initiate a data transfer over the bus) can make a memory request to memory 21 over bus 18. Requestor 10 can be any device that can initiate a memory operation, such as a processor. Depending on the direction of data flow between requestor 10 and memory 21, the data can be inverted by inverter 16 and reinverted by inverter 17, or it can be inverted by inverter 17 and reinverted by inverter 16. Alternately, it can be left as is, without inversion, by both inverters 16 and 17. Therefore, inverters 16 and 17 are each conditional inverters, i.e., they can invert the data or not invert the data, depending on a condition such as the state of a control signal. As previously described, the decision to invert or not can be based on minimizing the number of data signals that are active during the data transfer. A data line is considered active if the driver circuit actively switches the signal, while it is considered inactive if the driver circuit leaves the signal in its default state. Because most computer buses allow multiple devices to control each line, each data line will have a default state in which no devices are actively driving the signal, and an active state in which at least one device is driving the signal. In the case of a bipolar switch with pullup resistors, the line can be considered inactive if the driver transistor is turned off so that the signal is passively pulled up to its idle state, while the line can be considered active if the driver transistor is turned on so that the signal is switched to the opposite state. Generally, the active state is considered a logic '1', and the inactive state is considered a logic '0', but because logic states can be redefined at will, this definition is less useful.

If more than half the lines on the bus would normally be active during a transfer, all the data lines can be inverted so that less than half the lines on bus 18 will then be active. If less than half the lines on the bus would normally be inactive during a transfer, the data can be passed on to the bus without inversion, so that less than half the lines on bus 18 will be inactive. If exactly half the lines are active, the lines can be inverted or left alone, depending on the convention being followed. In one embodiment, the lines are not inverted, since the inversion does not reduce the number of active lines on bus 18.

Once the data is transmitted from inverter 16 to inverter 17, inverter 17 must know whether to reinvert the inverted data or leave the non-inverted data as is. This choice is determined by the state of inversion status line 19. If the data was inverted by inverter 16, decision logic 14 can indicate this by activating a signal on inversion status line 19. This signal can be detected by decision logic 35, which uses that information to determine whether to reinvert the data received from bus 18 or leave it as is. Thus the decision to invert or not invert, once made by decision logic 14 at the transmitting end, is transferred to decision logic 35 at the receiving end along with the associated data, so that the receiving end knows whether or not to reinvert the data. As before, inverter 17 is controlled by inversion decision logic 35.

For data transfers in the opposite direction, the functions are reversed, with decision logic 35 controlling whether the transmitted data is inverted by inverter 17, and simultaneously placing an inversion status signal on line 19 so that decision logic 14 will be able to tell inverter 16 whether or not to reinvert the received data. In one embodiment, status line 19 can be a single bidirectional bus line that both decision logic circuits 14 and 35 use for transmitting and receiving the inversion status signal.

Data that has gone from inverter 16 to inverter 17, whether it has been inverted/reinverted or not, is presented to error correcting code (ECC) logic 33 by inverter 17. In either case, the data presented to ECC logic 33 is in its normal (non-inverted) form. ECC logic 33 can then calculate an ECC code based on the data pattern, and write both the data and its associated ECC code in memory 21.

When data is to be transferred in the opposite direction, both the data and associated ECC code can be read from memory and presented to ECC logic 33, which recalculates the ECC code based on the data it receives from memory 21. It can then compare the newly determined ECC code with the code that was retrieved from memory. Since a particular combination of bits will always generate the same ECC code, the retrieved code should match the newly calculated code. It they match, the data will be forwarded to inversion logic 17 for a data transfer as previously described, but in the opposite direction. As before, the data will be inverted by logic 17 or not inverted, depending on the number of active data lines. If the new and old ECC codes do not match, one or more bits of the data retrieved from memory have been corrupted and must be corrected. The nature of ECC algorithms is such that most memory errors can be detected and corrected in this manner. ECC logic 33 has the capability to perform this correction, and the corrected data can then be passed from ECC logic 33 to inverter 17 for transmission to inverter 16. The art of ECC algorithms and circuits is well known, and will not be discussed in further detail.

The decision to invert or not invert the data before presenting it to bus 18 comes from inverter decision logic 35, which informs inverter 14 of its decision over status line 19. Inverter 16 can then reinvert the inverted data it receives, or not invert the non-inverted data, depending on the status signal received from decision logic 35 over status line 19.

As described, ECC logic 33 performs various functions during both read and write operations, functions that consume a non-trivial amount of time that can noticeably affect bus latency. Inversion decision logic 35 also performs various functions during both read and write operations. The functions performed during a read operation consume a non-trivial amount of time that can affect bus latency. By placing the inversion decision logic 35 in parallel with ECC logic 33, and performing the ECC functions and inversion decision functions simultaneously, bus latency does not suffer from the accumulated delays of both ECC and inversion decision. Instead, only the longer of the two delays will affect bus latency. In general, ECC calculations take longer than inversion decision calculations, so the time to make the inversion decision at the transmitting end does not affect bus latency at all. For the inversion decision logic at the data receiving end, no calculations are needed. The inversion decision can simply be passed on from inversion status line 19 to the receiving inverter. This can take as little as one gate delay time, so it is not a significant factor in bus latency.

Although bus inversion operations for a memory read are similar to those for a memory write, there are some differences, so each is described separately in more detail below.

Write Operations

A bus requestor 10 can make a memory write request to memory 21 over bus 18. When requestor 10 presents the data to be written, inversion decision logic 14 can monitor the data lines to determine whether more than half of the data signals are active. If more than half are active, logic 14 can send a signal to inverter 16 to invert all the data signals. If less than half are active, logic 14 can send a signal to not invert all the data signals. In one embodiment, the invert and not-invert signals are simply opposite states of the same signal on an inverter control line. Inverter 16 can consist of a group of conditional inverter gates, one for each data line, each of which will invert the associated signal or not invert it, depending on the state of the received control signal. Whether inverted or not, the data can then be placed on bus 18 for transmission to inverter 17. At approximately the same time, inverter decision logic 14 can place a signal on status line 19 indicating whether the data was inverted or not. In one embodiment, the signal on status line 19 and the control signal from decision logic 14 to inverter 16 are the same signal.

When the data is received at inverter 17, all the data lines may be inverted by a group of conditional inverter gates, similar to the conditional inverter gates of inverter 16, except that these are inverting the data received from bus 18 rather than the data being transmitted on bus 18. Whether all the data signals are inverted or not can be determined by a control signal from inverter decision logic 35. This control signal can be determined by the status of the signal on status line 19, which was generated by decision logic 14 and is received by decision logic 35. In this manner, data which was initially inverted by inverter 16 will be reinverted by inverter 17 to restore the data to its original form, while data which was not inverted by inverter 16 will not be reinverted by inverter 17. In either case, the data presented to ECC logic 33 by inverter 17 is the same data that was originally presented to inverter 16 by bus requestor 10. Thus, the end-to-end transfer of data can be preserved as it would be without DBI, while the benefits of DBI to the system can still be employed.

Read Operations

A bus requestor 10 can make a memory read request to memory 21 over bus 18. When memory 21 presents the data to be read (transmitted back to requester 10), inversion decision logic 35 can monitor the data lines to determine whether more than half of the data signals are active. If more than half are active, logic 35 can send a signal to inverter 17 to invert all the data signals. If less than half are active, logic 35 can send a signal to not invert all the data signals. In one embodiment, the invert and not-invert signals are simply opposite states of the same signal on an inverter control line. Inverter 17 can consist of a group of conditional inverter gates, one for each data line, each of which will invert the associated signal or not invert it, depending on the state of the received control signal. Whether inverted or not, the data can then be placed on bus 18 for transmission to inverter 16. At approximately the same time, inverter decision logic 35 can place a signal on status line 19 indicating whether the data was inverted or not. In one embodiment, the signal on status line 19 and the control signal from decision logic 35 to inverter 17 are the same signal.

At the same time the data lines are being monitored by decision logic 35, the data and the associated ECC code that were read from memory 21 are presented to ECC logic 33. ECC logic 33 recalculates the ECC code based on the data it receives from memory 21. It then compares the newly-determined ECC code with the code that was retrieved from memory. Since a particular combination of bits will always generate the same ECC code, the retrieved code should match the newly-calculated code. If they match, the data is forwarded to inversion logic 17 for a data transfer over bus 18. As previously described, inverter 17 can invert or not invert the data, depending on the control signal from decision logic 35, which in turn depends on the number of active lines in the data.

When the data is received over bus 18 by inverter 16, inverter 16 can invert or not invert the data, depending on the state of the control signal from decision logic 14. The state of this control signal depends on the state of the status signal on line 19, which was generated by decision logic 35. Thus, inverter 16 will reinvert the data if that data was previously inverted by inverter 17. Inverter 16 will not invert the data if it was not previously inverted by inverter 17. This choice is based on the control signal from decision logic 14 which is in turn determined by the state of the signal on status line 19. In either case, the data presented to requestor 10 from inverter 16 will have the same form as the data presented to inverter 17 by ECC logic 33. Thus, the end-to-end transfer of data can be preserved as it would be without DBI, while the benefits of DBI to the system can still be employed.

However, if ECC logic 33 determines that the newly calculated ECC code and the old ECC code read from memory do not match, one or more bits of the data retrieved from memory has been corrupted and must be corrected. The nature of ECC algorithms is such that most memory errors can be detected and corrected in this manner. ECC logic 33 has the capability to perform this correction, and the corrected data can then be passed from ECC logic 33 to inverter 17 for transmission to inverter 16. However, the correction process requires additional time, thus adding to the delay before the corrected data is presented to inverter 17 by ECC logic 33.

As described, in a memory read operation, ECC logic 33 calculates a new ECC code and compares it with the old ECC code before passing the data on to inverter 17. In addition, sometimes ECC logic 33 may also have to calculate a data correction and correct the data before passing the data on. At the same time, inversion decision logic 35 performs its own calculation to determine if more than half the bits in the data are active, and generates a signal to invert or not invert the data depending on the results of the data bit calculation. By placing the inversion decision logic 35 in parallel with ECC logic 33, and performing the ECC functions and inversion decision functions simultaneously, bus latency does not suffer from the accumulated delays of both ECC and inversion decision. Instead, only the longer of the two delays will affect bus latency. In general, ECC calculations, even without data correction, take longer than inversion decision calculations, so the time to make the inversion decision when ECC is employed does not affect bus latency at all. However, in the event that the inversion calculation may take longer than the ECC calculation, both ECC logic 33 and decision logic 35 can present separate 'ready' signals to inverter 17 or to a separate bus transmission circuit, so that the data will not be placed on the bus until both ECC logic 33 and decision logic 35 have completed their work.

For inversion decision logic 14 at the data receiving end, no calculations are needed. The decision to reinvert the inverted data or not invert the non-inverted data can simply be passed on from inversion status line 19 to the receiving inverter 16. This can take as little as one gate delay time, so it is not a significant factor in bus latency.

Figure 4:
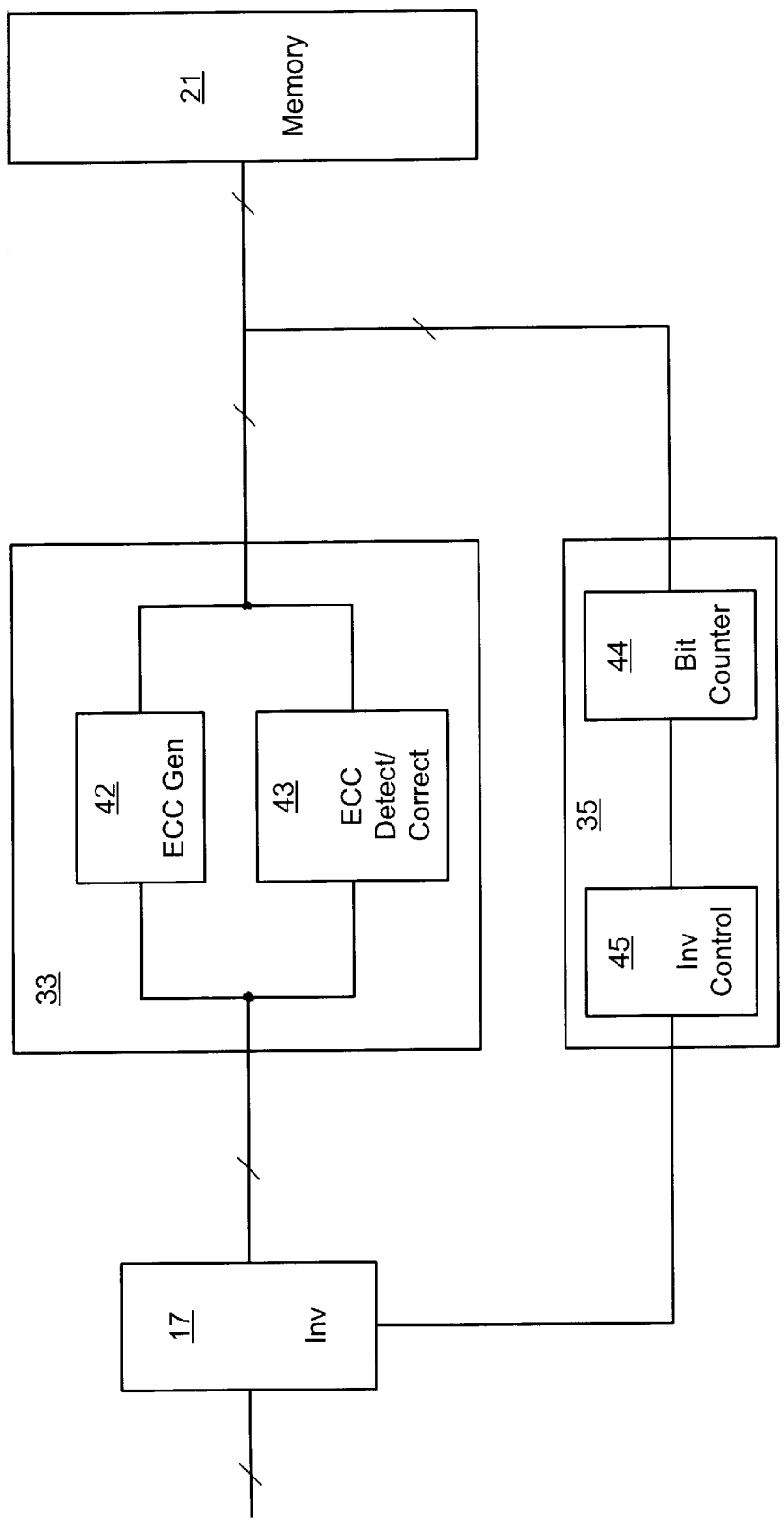
FIG. 4 shows a more detailed view of the ECC and DBI logic.

FIG. 4 shows a more detailed view of the DBI and ECC logic at the memory portion of the system. ECC logic 33 includes two portions, ECC generator 42 and ECC detection/correction logic 43. When incoming data is received by ECC logic 33 from inverter 17, ECC generator 42 calculates an error correction code that is unique for the specific data pattern contained in the incoming data. Both the data and the associated code are then passed on to memory 21, where they are stored together in a designated memory location. When the data is later read from that memory location, the associated code is also read and both are presented to ECC detection/correction logic 43. A new ECC code is then calculated from the data just read from memory, typically by the same circuit that calculated the original code. The new code and old code are then compared by ECC detection/correction logic 43. Since the same data pattern will always generate the same ECC code, the old and new codes should be identical. If they are, the data from memory is considered valid and is passed on to inverter 17 for placement on bus 18. If the codes do not match, the data read from memory is assumed to be in error, in the form of one or more incorrect bits. The nature of ECC technology is such that most such errors can be isolated and corrected, based on the ECC code, the data pattern, and the ECC algorithms. ECC detection/correction logic 43 performs this correction, and then passes the corrected data on to inverter 17 for presentation to bus 18.

When read data is presented to ECC logic 33 from memory 21, the data is also monitored by inversion decision logic 35, which determines how many bits in the data are active. This determination can take several forms. In one embodiment, the number of bits is determined by bit counter 44, which adds up the number of active bits in the data. If the number exceeds a predetermined total, bit counter 44 indicates this to inversion control logic 45, which sends the appropriate 'invert' control signal to inverter 17. If the number does not exceed the predetermined total, bit counter 44 also indicates this to inversion control logic 45, which sends the appropriate 'don't invert' control signal to inverter 17. The predetermined total can be one-half of the total number of bits in the data.

Since the data being monitored by decision logic 35 is the data directly from memory, this data may contain errors that are later corrected by ECC logic 33. Thus, the data seen by decision logic 35 may contain fewer than one-half active data lines, while the data presented to the data bus may contain more, or vice-versa. This apparent conflict can be handled in several ways.

In one embodiment, the discrepancy is ignored. The data is inverted or not, based on the faulty data pattern retrieved from memory, which can result in more than one half of the data lines on bus 18 being active. However, regardless of the number of active lines, the data is still inverted at both ends or not inverted at both ends, so the correct data is still received by the requesting device. Since this condition should rarely occur, an occasional transfer involving more than one-half active lines should not be of concern.

In another embodiment, ECC logic 33 writes the corrected data back to the same memory location so that subsequent reads should retrieve the correct data. While doing so, this corrected data will be seen by decision logic 35, which can then properly compute whether or not the data contains more than one-half active lines.

Although the foregoing description is written in terms of data lines, the same principle can be applied to address lines, status lines, or any other types of lines. Also, multiple types of functional lines can be treated as a single group by the bus inversion scheme. Thus, a bus with a 32 address lines and 32 data lines can be treated as a single 64-bit wide bus by the bus inversion scheme if the address and data signals are transmitted at the same time.

Although only a single requestor 10 and a single memory 21 are shown in the figures, the invention can also be employed on a bus having more than two devices, in which each device has its own inverter and inversion decision logic.

Although the previous description of the bus describes all lines on the bus being inverted or not inverted as a group, the bus may be divided into smaller sections, with each section having its own independent bus inversion logic that operates independently of the other sections. For example, a 64-bit bus might have four 16-bit sections, with each section operating to limit the number of active lines to eight.

Although ECC has been described in the disclosure as the function to be operated in parallel with DBI, similar benefits can be obtained by operating DBI in parallel with other time-consuming bus functions.

The foregoing description is intended to be illustrative and not limiting. Variations will occur to those of skill in the art. Those variations are intended to be included in the invention, which is limited only by the spirit and scope of the appended claims.

We claim:

1. An apparatus, comprising:
    a first bus unit coupled between a first bus device and a bus, the first bus unit including:
        a first conditional bus inverter to conditionally invert each of a plurality of bus signals from the first bus device to the bus;
        first decision logic to make a determination whether to invert the plurality of bus signals with the first conditional bus inverter based on a condition; and
    a second bus unit coupled between the first bus device and the bus, the second bus unit including logic to perform a bus-related function at the same time the first decision logic is determining whether to invert the plurality of bus signals.

2. The apparatus of claim 1, wherein the second bus unit is an error correcting code unit.

3. The apparatus of claim 1, wherein the condition is the number of bus signals from the first bus device that are active.

4. The apparatus of claim 3, wherein the determination is to invert the plurality of bus signals if more than half the bus signals from the first bus device are active and to not invert the plurality of bus signals if less than half the bus signals from the first bus device are active.

5. The apparatus of claim 1, further comprising:
    a third bus unit coupled between a second bus device and the bus, the third bus unit including:
        a second conditional bus inverter to conditionally invert each of the plurality of bus signals from the bus to the second bus device; and
        second decision logic to make a determination whether to invert the plurality of bus signals with the second conditional bus inverter based on a control signal from the first bus unit;
    wherein the control signal is to indicate inverting with the second conditional bus inverter if the first conditional bus inverter inverts and to indicate not inverting with the second conditional bus inverter if the first conditional bus inverter does not invert.

6. The apparatus of claim 5, wherein the second bus device is a bus requester.

7. The apparatus of claim 1, wherein the first bus device is a memory.

8. A computer system, comprising:
    a bus;
    a processor and a bus device coupled to the bus;
    a first bus unit coupled between the bus device and the bus, the first bus unit including:
        a first conditional bus inverter to conditionally invert each of a plurality of bus signals from the bus device to the bus;
        first decision logic to make a determination whether to invert the plurality of bus signals with the first conditional bus inverter based on a condition;
    a second bus unit coupled between the bus device and the bus, the second bus unit including logic to perform a data-related function at the same time the first decision logic is determining whether to invert the plurality of bus signals; and
    a third bus unit coupled between the processor and the bus.

9. The system of claim 8, wherein the second bus unit is an error correcting code unit.

10. The system of claim 8, wherein the condition is the number of bus signals from the bus device that are active.

11. The system of claim 10, wherein the determination is to invert the plurality of bus signals if more than half the bus signals from the bus device are active and to not invert the plurality of bus signals if less than half the bus signals from the bus device are active.

12. The system of claim 8, wherein:

the third bus unit includes:

a second conditional bus inverter to conditionally invert each of the plurality of bus signals from the bus to the processor;

second decision logic to make a determination whether to invert the plurality of bus signals with the second conditional bus inverter based on a control signal from the first bus unit; and the control signal is to indicate inverting with the second conditional bus inverter if the first conditional bus inverter inverts and to indicate not inverting with the second conditional bus inverter if the first conditional bus inverter does not invert.

13. The system of claim 8, wherein the bus device is a memory.

14. A method, comprising:

requesting data from a first bus device;

providing the data in the form of data signals from the first bus device to first and second bus units, wherein the first bus unit includes a conditional inverter to invert the data signals based on a condition;

determining by the first bus unit if the condition is met;

inverting the data signals if the condition is met and not inverting the data signals if the condition is not met;

performing a function in the second bus unit at the same time as the determining and inverting, such that time required for determining and inverting does not contribute to bus latency cumulatively with time required for performing; and transmitting the data over a bus, whether or not the data signals are inverted.

15. The method of claim 14, wherein performing a function includes performing an error correction code function.

16. The method of claim 14, wherein determining if the condition is met includes determining if more than half the data signals active.

17. The method of claim 14, further including:

receiving the data at a third bus unit; and reinverting the data signals if the data signals were inverted in the first bus unit and not inverting the data signals if the data signals were not inverted in the first bus unit.

18. The method of claim 17, wherein:

receiving the data at a third bus unit includes receiving a status signal at the third bus unit from the first bus unit; and reinverting and inverting are based on a state of the status signal.

19. The method of claim 14, wherein the time required for determining and inverting is less than the time required for performing.

* * * * *